(12) United States Patent
Forrest et al.

(10) Patent No.: US 7,683,536 B2
(45) Date of Patent: Mar. 23, 2010

(54) OLEDS UTILIZING DIRECT INJECTION TO THE TRIPLET STATE

(75) Inventors: Stephen Forrest, Princeton, NJ (US); Julia J. Brown, Yardley, PA (US); Mark E. Thompson, Anaheim Hills, CA (US)

(73) Assignees: The Trustees of Princeton University, Princeton, NJ (US); Universal Display Corporation, Ewing, NJ (US); The University of Southern California, Los Angeles, CA (US)

( * ) Notice: Subject to any disclaimer, the term of this patent is extended or adjusted under 35 U.S.C. 154(b) by 1132 days.

(21) Appl. No.: 11/274,091

(22) Filed: Nov. 16, 2005

(65) Prior Publication Data

US 2006/0279204 A1 Dec. 14, 2006

Related U.S. Application Data

(63) Continuation-in-part of application No. 11/123,155, filed on May 6, 2005, now abandoned.

(60) Provisional application No. 60/666,867, filed on Mar. 31, 2005.

(51) Int. Cl.
*H05B 33/00* (2006.01)
*H01L 51/50* (2006.01)

(52) U.S. Cl. ...................... 313/506; 313/917

(58) Field of Classification Search ............ None
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 5,925,980 A | 7/1999 | So et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,310,360 B1 | 10/2001 | Forrest et al. | |
| 6,337,102 B1 | 1/2002 | Forrest et al. | |
| 6,468,819 B1 | 10/2002 | Kim et al. | |

(Continued)

FOREIGN PATENT DOCUMENTS

EP 1 391 944 2/2004

(Continued)

OTHER PUBLICATIONS

U.S. Appl. No. 10/233,470, filed Sep. 4, 2002, Shtein et al.

(Continued)

*Primary Examiner*—Ashok Patel
(74) *Attorney, Agent, or Firm*—Kenyon & Kenyon LLP

(57) ABSTRACT

The present invention relates to OLEDs utilizing direct injection to the triplet state. The present invention also relates to OLEDs utilizing resonant injection and/or stepped energy levels.

10 Claims, 10 Drawing Sheets

U.S. PATENT DOCUMENTS

| | | | |
|---|---|---|---|
| 6,548,956 | B2 | 4/2003 | Forrest et al. |
| 6,576,134 | B1 | 6/2003 | Agner |
| 6,602,540 | B2 | 8/2003 | Gu et al. |
| 6,645,645 | B1 * | 11/2003 | Adachi et al. ............... 428/690 |
| 6,830,828 | B2 | 12/2004 | Thompson et al. |
| 6,835,469 | B2 | 12/2004 | Kwong et al. |
| 6,939,624 | B2 * | 9/2005 | Lamansky et al. .......... 428/690 |
| 2002/0113545 | A1 | 8/2002 | Adachi et al. |
| 2002/0182441 | A1 | 12/2002 | Lamansky et al. |
| 2003/0230980 | A1 | 12/2003 | Forrest et al. |
| 2004/0174116 | A1 | 9/2004 | Lu et al. |
| 2004/0209116 | A1 | 10/2004 | Ren et al. |
| 2004/0258956 | A1 | 12/2004 | Matsusue |

FOREIGN PATENT DOCUMENTS

| | | |
|---|---|---|
| WO | WO 99/48160 | 9/1999 |
| WO | WO 02/074015 | 9/2002 |

OTHER PUBLICATIONS

"Inorganic Chemistry" (21$^{nd}$ Edition) by Gary L. Miessler and Donald A. Tarr, Prentice Hall, pp. 1-3, 422-424, 442, Aug. 1999 version.

15$^{th}$ FPD R& D and Manufacturing Technology Expo and Conference; Progress in the Evolution of Organic EL Material and Moves Toward Practical Application, Apr. 20-22, 2005. Tower Bldg., Tokyo Big Sight, Japan.

Adachi et al., "Nearly 100% Internal Phosphorescent Efficiency in an Organic Light Emitting Device," J. Appl. Phys., vol. 90, pp. 5048-05051 (2001).

Baldo et al., "Highly Efficient Phosphorescent Emission from Organic Electroluminescent Devices," Nature, vol. 395, pp. 151-154 (1998).

Baldo et al., "Very High-Efficiency Green Organic Light-Emitting Devices Based on Electrophosphorescence," Appl. Phys. Lett., vol. 75, No. 3, pp. 4-6 (1999).

D'Andrade et al., "Relationship between the ionization and oxidation potentials of molecular organic semiconductors", Org. Elec. 2005.

Loy et al. "Thermally Stable Hole-Transporting Materials Based upon a Fluorene Core", Adv. Func. Mater, 12, No. 4, 245-249, 2002.

Partial International Search Report, PCT/US06/011881, mailed Sep. 13, 2006.

Tsuboi et al., 2005, "Energy transfer in a thin film of PTD fluorescent molecules dopes with PtOEP and Ir(ppy)3 phosphorescent molecules", App. Phys. vol. B81, No. 2, pp. 93-99.

Ikai et al., 2001, "Highly efficient phosphorescence from organic light-emitting devices with an exciton block layer", Appl. Phys. Lett. 79(2):156-158.

Huang et al., 2003, "Realization of high efficiency/high-luminance small-molecule organic light emitting diodes: synergistic effects of siloxane anode functionalization/hole-injection layers, and hole/exciton-blocking/electron transport layers", Appl. Phys. Lett. 82(3):331-333.

* cited by examiner

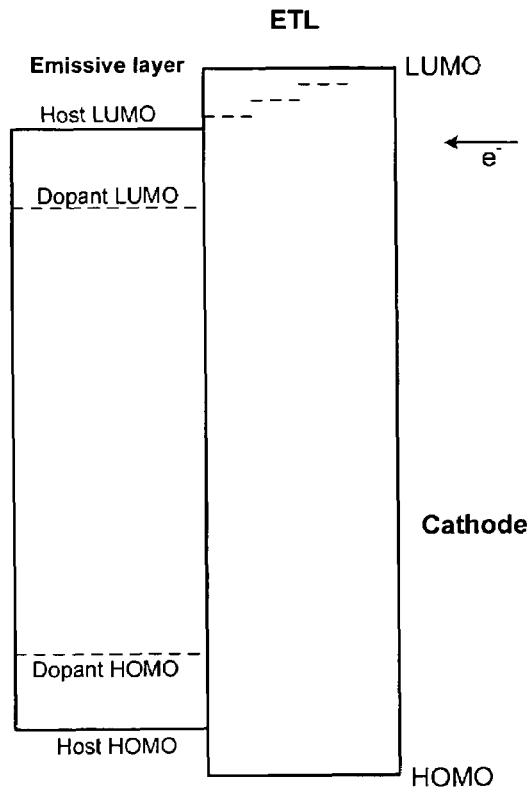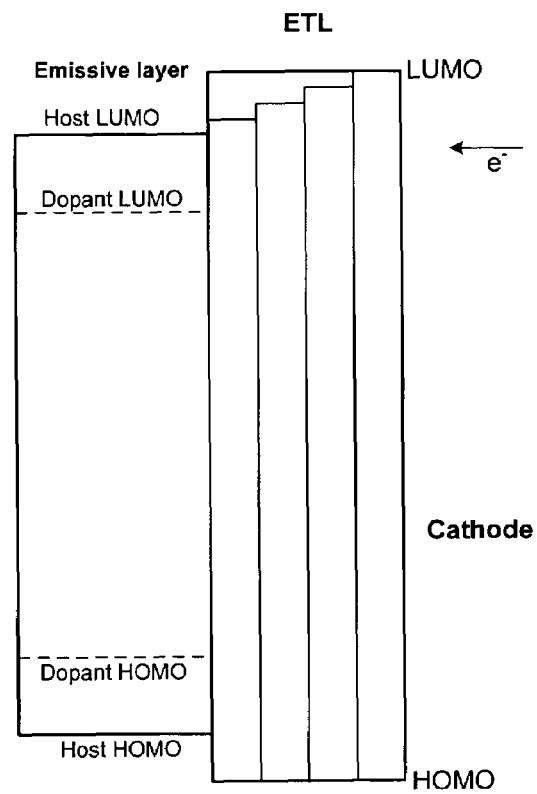
Figure 8A
Figure 8B

OLEDS UTILIZING DIRECT INJECTION TO THE TRIPLET STATE

This application is a continuation-in-part of U.S. patent application Ser. No. 11/123,155 filed May 6, 2005 now abandoned, which is incorporated by reference in its entirety. This application claims the benefit of U.S. Provisional Patent Application Ser. No. 60/666,867 filed Mar. 31, 2005.

RESEARCH AGREEMENTS

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to OLEDs utilizing direct injection to the triplet state.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

SUMMARY OF THE INVENTION

In one embodiment, the present invention provides an organic light emitting device comprising: a) an anode; b) a cathode; c) an emissive layer disposed between the anode and the cathode, the emissive layer comprising i) a phosphorescent dopant having a phosphorescent dopant HOMO energy level, a phosphorescent dopant LUMO energy level, a triplet energy, and a singlet energy, and ii) an emissive layer host having an emissive layer host HOMO energy level and an emissive layer host LUMO energy level; and d) a transport layer disposed adjacent to the emissive layer, the transport layer comprising a first material having a first material HOMO energy level and a first material LUMO energy level, wherein an electron-hole pair directly recombine across an energy separation that is about equal to the triplet energy of the phosphorescent dopant.

In a preferred embodiment, the organic light emitting device includes an energy separation that is at least about equal to the triplet energy of the phosphorescent dopant. The energy level separation can be between the emissive layer host LUMO and the phosphorescent dopant HOMO, the emissive layer host HOMO and the phosphorescent dopant LUMO, an electron transport material LUMO and the phosphorescent dopant HOMO, a hole transport material HOMO and the phosphorescent dopant LUMO, or an electron transport material LUMO and a hole transport material HOMO. Preferably, the energy separation is at least about 0.2 eV less than the singlet energy of the phosphorescent dopant.

In a preferred embodiment, the phosphorescent dopant has a peak in the emission spectra that is less than about 500 nm.

In another embodiment, the present invention provides an organic light emitting device comprising: a) an anode; b) a cathode; c) an emissive layer disposed between the anode and the cathode, the emissive layer comprising i) a phosphorescent dopant having a phosphorescent dopant HOMO energy level, a phosphorescent dopant LUMO energy level, a triplet energy, and a singlet energy, and ii) an emissive layer host having an emissive layer host HOMO energy level and an emissive layer host LUMO energy level; and d) a transport layer disposed adjacent to the emissive layer, the transport layer comprising a plurality of materials, each material having a HOMO energy level and a LUMO energy level, wherein at least one energy level of each of the plurality of materials together form a series of energy steps leading to at least one energy level in the emissive layer, wherein each step in the series of energy steps is no more than about 0.2 eV.

The series of energy steps can be formed by sublayers doped with a single material, sublayers doped with a mixture of materials, neat sublayers, or a combination thereof.

The present invention also provides methods for making the devices of the present invention.

BRIEF DESCRIPTION OF THE DRAWING

FIG. 8A shows an energy level diagram depicting an electron transport layer doped with a mixture of materials forming a series of energy steps. FIG. 8B depicts an electron transport layer comprising a plurality of neat layers forming a series of energy steps.

DETAILED DESCRIPTION

Figure 1:
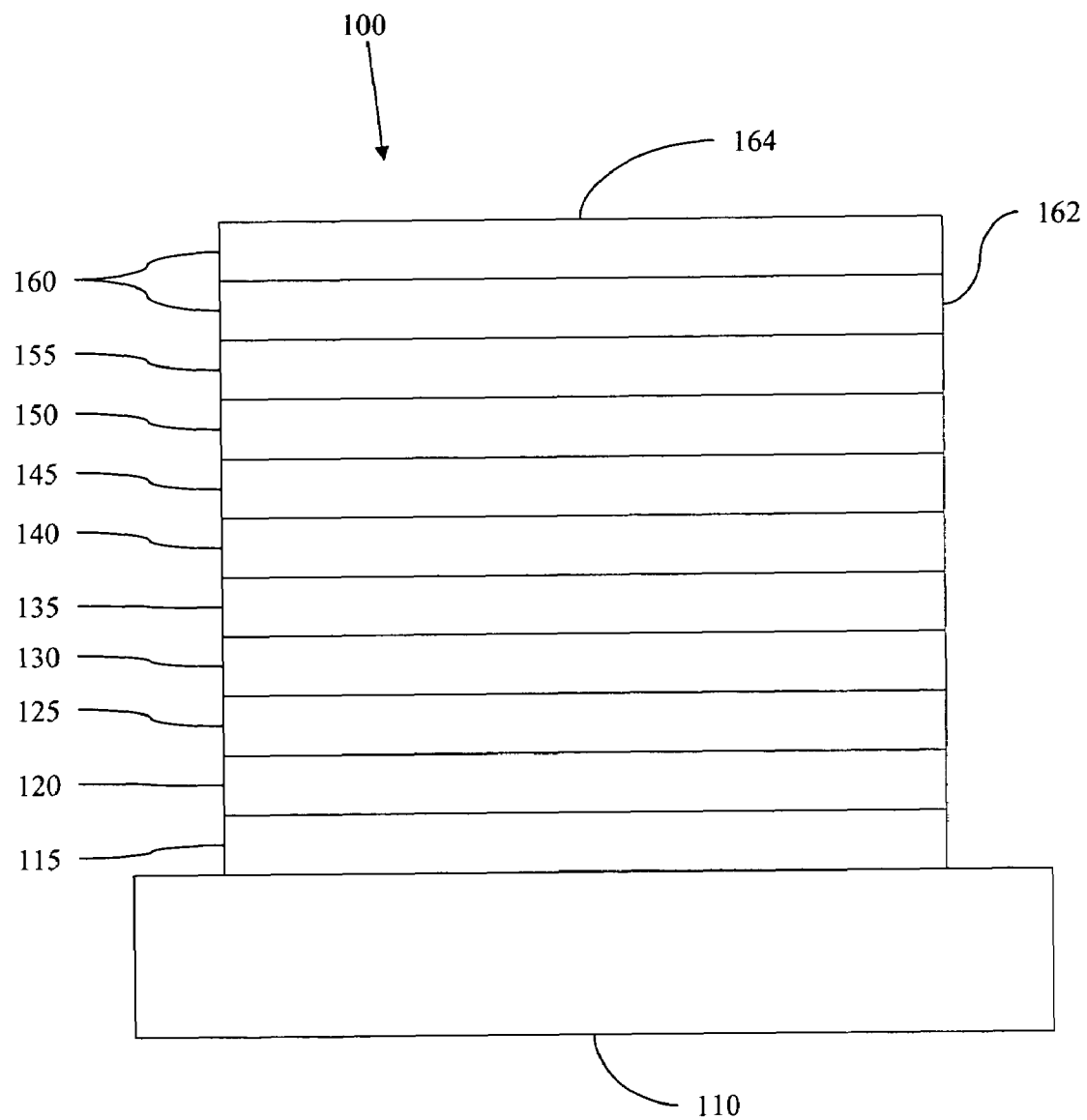
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238; 6,310,360; 6,830,828 and 6,835,469; U.S. Patent Application Publication No. 2002-0182441; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-0230980 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of host materials include Alq$_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. Alq$_3$ is an example of an intrinsic electron transport layer. An example of an n-doped electron transport layer is BPhen doped with Li at a molar ratio of 1:1, as disclosed in United States Patent Application Publication No. 2003-0230980 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-0230980 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
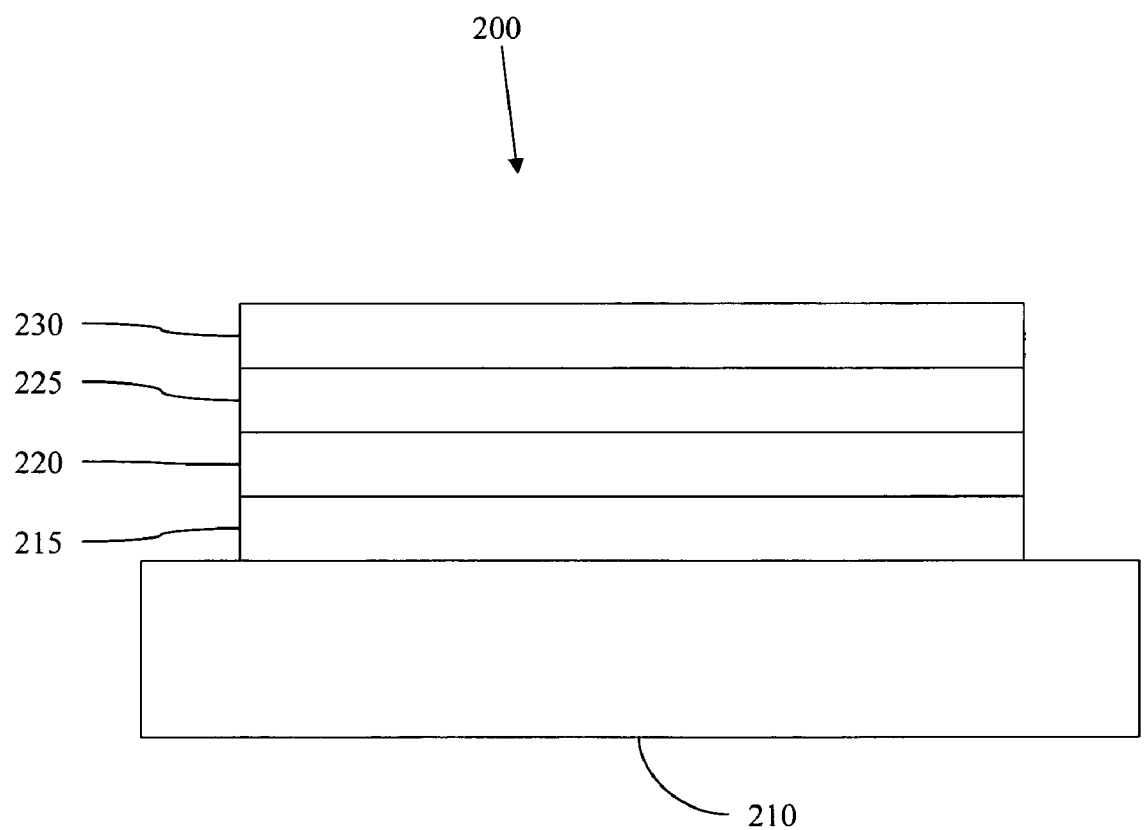
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In one embodiment, the present invention provides OLEDs utilizing direct injection to the triplet state of the phosphorescent dopant. The inventors have surprisingly found that it is possible to inject a charge directly into the triplet state without first going to the singlet state. Direct access to the triplet state was previously considered not possible. The known phosphorescence mechanism requires adding excess energy to excite the electron up to the singlet state. Such excess energy may degrade the phosphorescent dopant, particularly in the case of blue phosphors. In contrast, embodiments of the present invention achieve phosphorescence by directly accessing the triplet energy state. The direct access mechanism of the present invention does not require excess energy to reach the singlet state, and thus is less likely to degrade the phosphor.

In one embodiment, the present invention provides an OLED comprising: a) an anode; b) a cathode; c) an emissive layer disposed between the anode and the cathode, the emissive layer comprising i) a phosphorescent dopant having a phosphorescent dopant HOMO energy level, a phosphorescent dopant LUMO energy level, a triplet energy, and a singlet energy, and ii) an emissive layer host having an emissive layer host HOMO energy level and an emissive layer host LUMO energy level; and d) a transport layer disposed adjacent to the emissive layer, the transport layer comprising a first material having a first material HOMO energy level and a first material LUMO energy level, wherein an electron-hole pair directly recombine, that is, without populating a higher lying molecular excited state, across an energy separation that is about equal to the triplet energy of the phosphorescent dopant.

Figure 3:
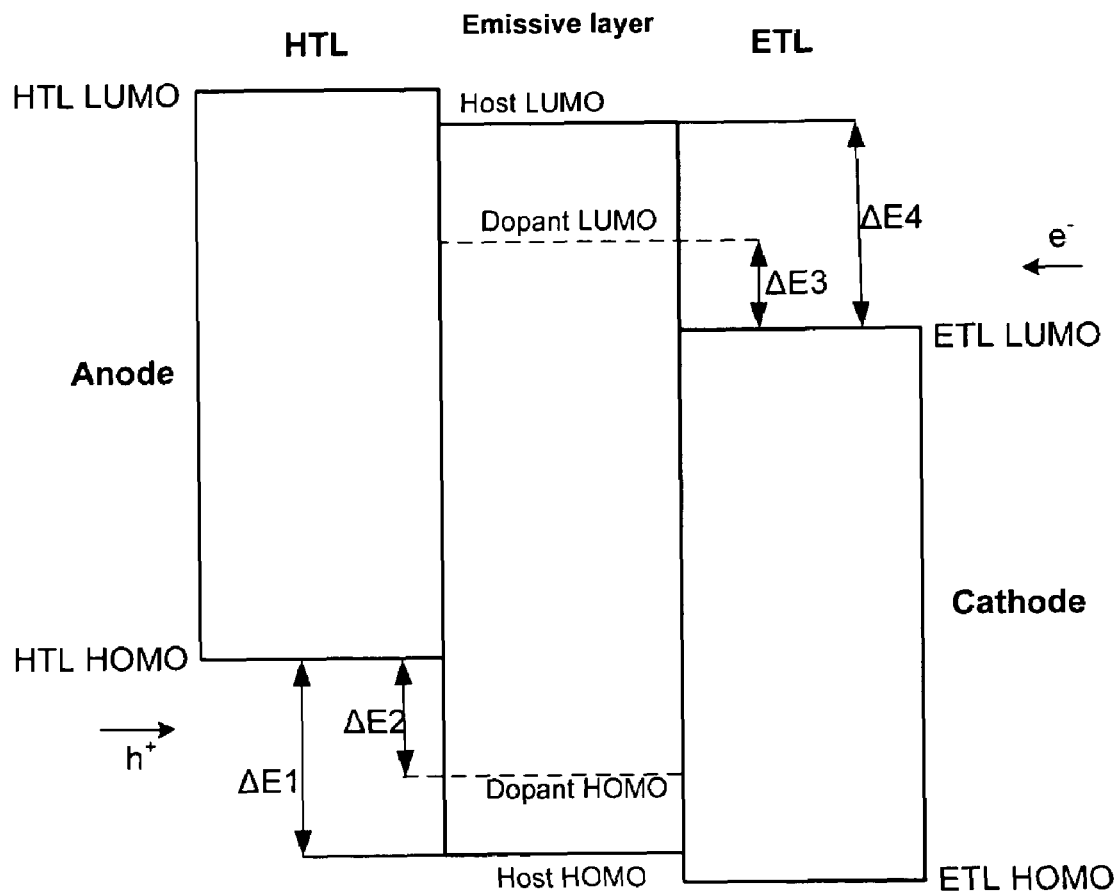
FIG. 3 shows an energy level diagram designating ΔE1-4, the possible sites of resonant injection.
Figure 4:
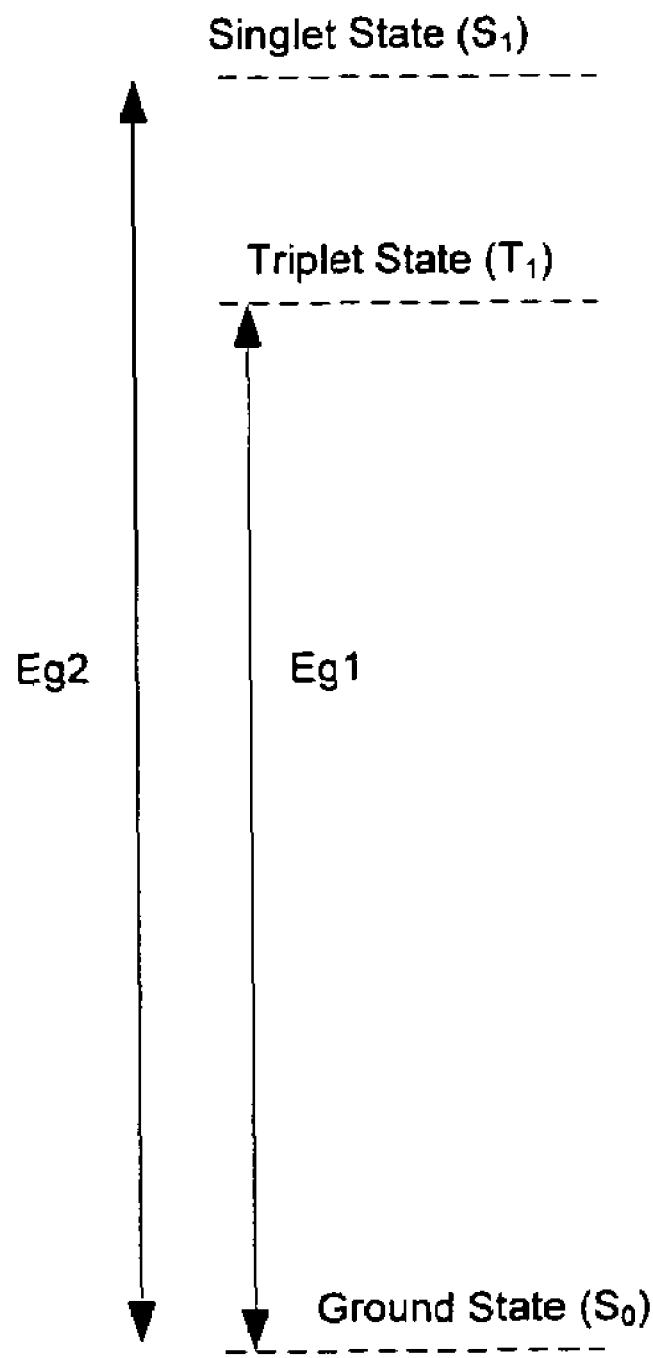
FIG. 4 shows the triplet state ($T_1$) and the singlet state ($S_1$) of the dopant.

The phosphorescent dopant has a HOMO and a LUMO as well as excited state energy levels: the ground state, the triplet state, and a higher lying molecular excited state. The higher lying molecular excited state can be, for example, the singlet state. FIG. 3 shows the phosphorescent dopant HOMO and LUMO, while FIG. 4 shows the ground state ($S_0$), triplet state ($T_1$), and singlet state ($S_1$). The triplet energy (Eg1) is the energy separation between the ground state and the triplet state. The singlet energy (Eg2) is the energy separation between the ground state and the higher lying molecular excited state.

A transport layer comprises a first material. The transport layer can be a hole transport layer, i.e., a transport layer on the anode side of the emissive layer, or an electron transport layer, i.e., a transport layer on the cathode side of the emissive layer. In one embodiment, the OLEDs of the present invention utilize such a transport layer on both sides of the emissive layer. The first material can be a transport layer host, or it can be a transport layer dopant. The first material can also be the only material in the transport layer, i.e., the first material can be deposited as a neat layer.

As used herein, the term "adjacent" means close enough for a charge to jump directly from one material to the other. The adjacent materials do not necessarily have to be in direct physical contact with one another.

The first material can be selected from the variety of transport materials known to one of skill in the art. For example, known materials such as TCTA can be used as the first material. Other useful materials include those disclosed in Loy et al., "Thermally Stable Hole-Transporting Materials Based upon a Fluorene Core," Adv. Func. Mater., 12, No. 4, 245-249, 2002, and D'Andrade et al., "Relationship between the ionization and oxidation potentials of molecular organic semiconductors," Org. Elec., 2005.

To directly access the triplet state, the organic light emitting device includes an energy separation that is at least about equal to the triplet energy of the phosphorescent dopant. The energy level separation can be between the emissive layer host LUMO and the phosphorescent dopant HOMO, the emissive layer host HOMO and the phosphorescent dopant LUMO, an electron transport material LUMO and the phosphorescent dopant HOMO, a hole transport material HOMO and the phosphorescent dopant LUMO, or an electron transport material LUMO and a hole transport material HOMO. By having an energy separation that is at least about equal to the triplet energy, recombination can occur across an energy separation that is about equal to the triplet energy. The energy separation is about equal to the triplet energy when it is no more than about 0.1 eV different from the triplet energy. The hole and electron can recombine from adjacent molecules.

In a preferred embodiment, the energy separation between the phosphorescent dopant HOMO and the emissive layer host LUMO is at least about equal to the triplet energy of the phosphorescent dopant. In another preferred embodiment, the energy separation between an electron transport material LUMO and a hole transport material HOMO is at least about equal to the triplet energy of the phosphorescent dopant.

To avoid higher lying molecular excited states of the phosphorescent dopant, the energy separation that is at least about equal to the triplet energy is also preferably at least about 0.2 eV less than the singlet energy of the phosphorescent dopant. Phosphorescent materials useful in this embodiment include phosphorescent dopants wherein the higher lying molecular excited state and triplet state are separated by at least about 0.2 eV. Carbene molecules, for example, exemplify a desirable singlet-triplet separation useful in certain embodiments of the present invention.

In another embodiment, direct access to the triplet state is facilitated by resonant injection. For the purposes of the present invention, resonant injection encompasses both resonant injection and near resonant injection from one energy level to another, wherein the energy levels are positioned such that a charge can traverse the energy difference by thermal transfer. The position of the energy levels, not the actual mechanism of transfer, characterizes resonant injection in the embodiments of the present invention.

To enable thermal transfer, the energy levels may be positioned above or below one another. If a hole moves to a higher energy level or an electron moves to a lower energy level, thermal transfer will occur even though the energy difference may be large. For example, in FIG. 5, the transport layer is a hole transport layer, and the first material HOMO is positioned below the phosphorescent dopant HOMO. The transfer of holes "upward" is energetically favored because the charge is moving to a lower energy state. If a hole moves to a lower energy level or an electron moves to a higher energy level, thermal transfer can still occur, but the energy difference must be small. Thus, for example, the first material HOMO can also be above the phosphorescent dopant HOMO as long as the energy levels are close enough to allow charges to be thermally transferred. In general, when the charge must move to a higher energy state, the distribution of energy among charge carriers may be such that a significant number of charge carriers have sufficient energy to overcome the barrier. A barrier of not more than about 0.1 eV, for example, may be readily overcome.

Even though a charge can be thermally transferred across a relatively large energy difference in the energetically favored direction, the distance between the energy levels is preferably limited in order to reduce damage to the recipient molecule. When a charge with excess energy is transferred to a molecule, the excess energy can damage the molecule. Damage is reduced by energy level alignment because the charge does not carry much excess energy upon transfer. Thus, in a preferred embodiment, a first material energy level is sufficiently aligned with an energy level in the emissive layer to reduce damage to the emissive layer. In other words, the energy difference between the aligned energy levels is no more than the damage threshold. The energy difference is preferably no more than about 0.2 eV, more preferably less than or equal to 0.2 eV.

In one embodiment, the present invention provides an OLED comprising: a) an anode; b) a cathode; c) an emissive layer disposed between the anode and the cathode, the emissive layer comprising i) a phosphorescent dopant having a phosphorescent dopant HOMO energy level, a phosphorescent dopant LUMO energy level, a triplet energy, and a singlet energy, and ii) an emissive layer host having an emissive layer host HOMO energy level and an emissive layer host LUMO energy level; and d) a transport layer disposed adjacent to the emissive layer, the transport layer comprising a first material having a first material HOMO energy level and a first material LUMO energy level, wherein a charge can be thermally transferred from at least one first material energy level to at least one energy level in the emissive layer.

FIG. 3 shows an energy level diagram designating the possible sites of resonant injection as $\Delta E1$-4. Although $\Delta E1$-4 are drawn such that holes are likely moving from the HTL HOMO downward to the emissive layer and the electrons are likely moving from the ETL LUMO upward to the emissive layer, the present invention encompass OLEDs in which the charges move in either direction. That is, $\Delta E1$-4 also encompass OLEDs in which holes are likely moving from the HTL HOMO upward to the emissive layer and the electrons are likely moving from the ETL LUMO downward to the emissive layer. FIGS. 3-8 are not necessarily drawn to scale and represent energy level positions merely to aid in the understanding of the present invention.

In one embodiment, as shown in FIG. 3, the energy levels of the phosphorescent dopant are nested within the emissive layer host energy levels. This configuration reduces non-radiative recombination. Non-radiative recombination occurs in OLEDs when the concentration of the emissive dopant is too high resulting in triplet-triplet annihilation.

Figure 5:
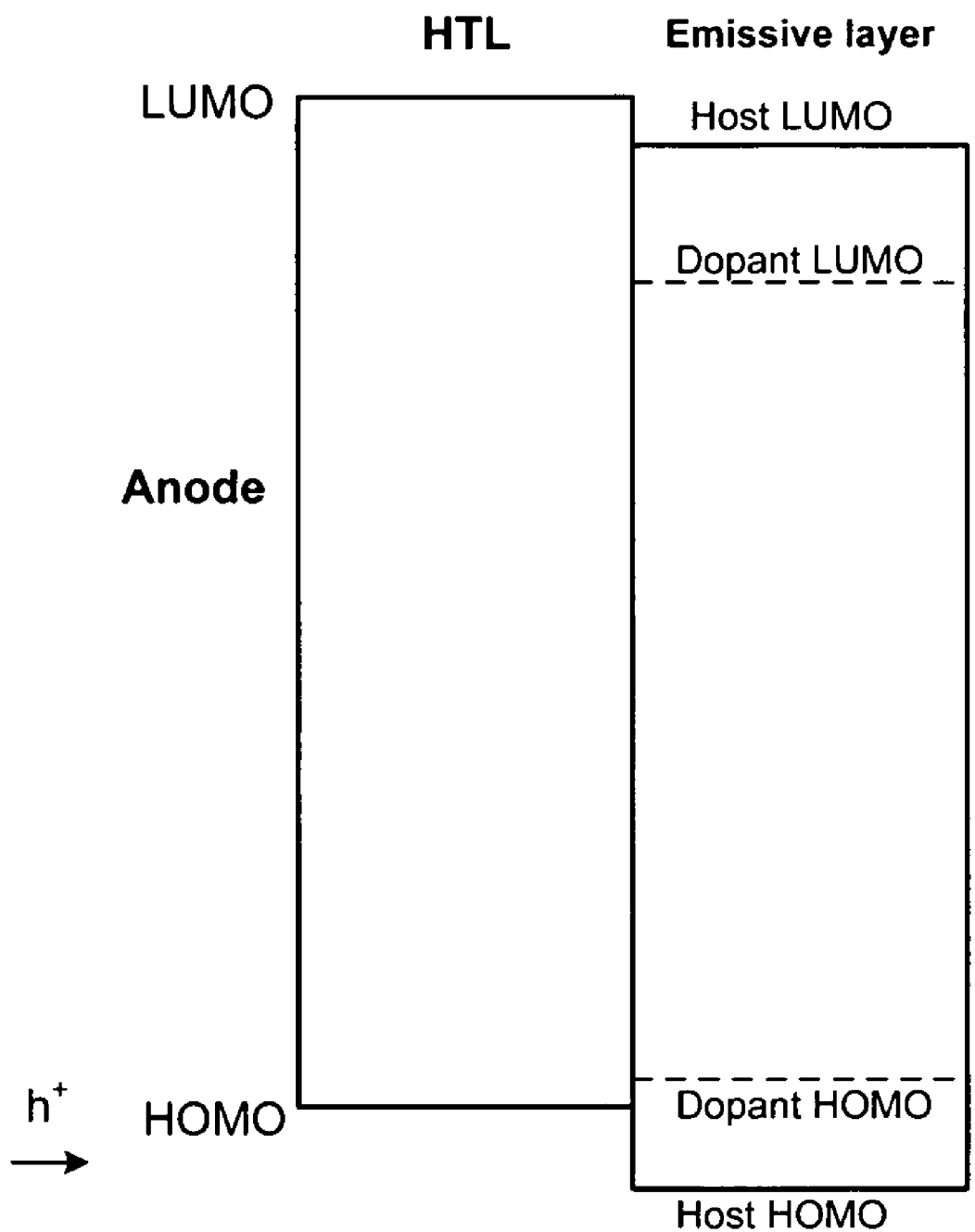
FIG. 5 shows an energy level diagram in which the first material HOMO is aligned with the phosphorescent dopant HOMO.

In one embodiment, the transport layer is a hole transport layer, and a hole is resonantly injected from the hole transport layer into the emissive layer. In one embodiment, resonant injection occurs at $\Delta E1$: the energy levels are positioned such that a hole can be thermally transferred from the first material HOMO to the emissive layer host HOMO. In another embodiment, resonant injection occurs at $\Delta E2$: a hole can be thermally transferred from the first material HOMO to the phosphorescent dopant HOMO. This embodiment is depicted in FIG. 5.

In a preferred embodiment, the first material HOMO is aligned with the emissive layer host HOMO or the phosphorescent dopant HOMO. Preferably, the first material HOMO is about 0 to about 0.2 eV lower than the emissive layer host HOMO or the phosphorescent dopant HOMO. Such a configuration allows the hole to transfer from the transport layer to the emissive layer across small energy step in a direction that is energetically favored.

In yet another embodiment, the transport layer further comprises a second material having a second material HOMO energy level, wherein the second material HOMO is about 0 to about 0.2 eV lower than the first material HOMO. Such a configuration provides two energy steps. The transport layer may further contain a series of such energy steps, as described in further detail below.

Figure 6:
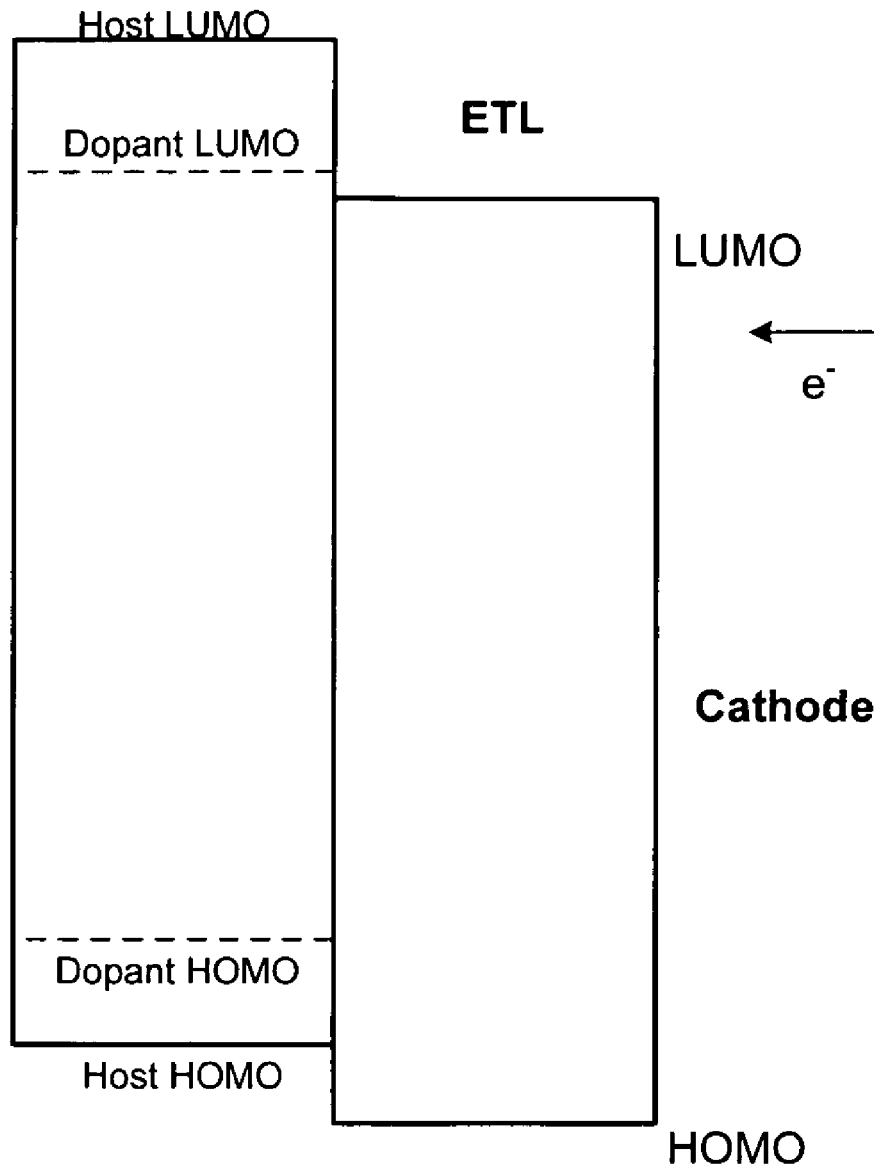
FIG. 6 shows an energy level diagram in which the first material LUMO is aligned with the phosphorescent dopant LUMO.
Figure 7A:
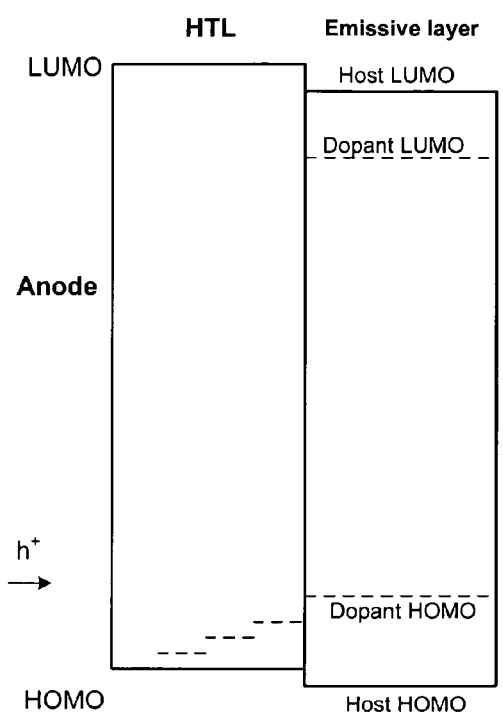
FIG. 7A shows an energy level diagram depicting a hole transport layer doped with a mixture of materials forming a series of energy steps.
Figure 7B:
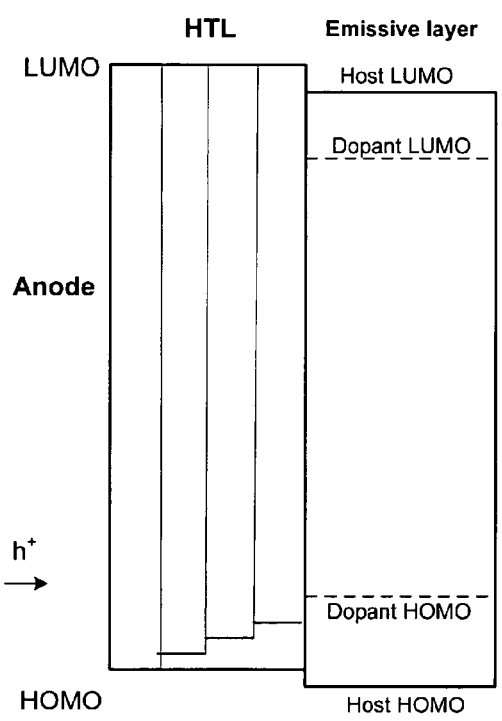
FIG. 7B depicts a hole transport layer comprising a plurality of neat layers forming a series of energy steps.

In another embodiment, the transport layer is an electron transport layer, and an electron is resonantly injected from the electron transport layer into the emissive layer. In one embodiment, resonant injection occurs at $\Delta E4$: an electron can be thermally transferred from the first material LUMO to the emissive layer host LUMO. See, e.g., FIG. 8. In another embodiment, resonant injection occurs at $\Delta E3$: an electron can be thermally transferred from the first material LUMO to the phosphorescent dopant LUMO. This embodiment is depicted in FIG. 6.

In a preferred embodiment, the first material LUMO is aligned with the emissive layer host LUMO or the phosphorescent dopant LUMO. Preferably, the first material LUMO is about 0 to about 0.2 eV higher than the emissive layer host LUMO or the phosphorescent dopant LUMO. Such a configuration allows the electron to transfer from the transport layer to the emissive layer across a small energy step in a direction that is energetically favored.

In another embodiment, the transport layer further comprises a second material having a second material LUMO energy level, wherein the second material LUMO is about 0 to about 0.2 eV higher than the first material LUMO. Such a configuration provides two energy steps. The transport layer may further contain a series of such energy steps, as described in further detail below.

In another embodiment, both an electron and a hole are resonantly injected into the emissive layer as described above.

In one embodiment, the present invention provides a device that emits blue light. In a preferred embodiment, the phosphorescent compound has a peak in the emission spectra that is less than about 500 nm, preferably less than about 450 nm. Achieving blue emission is particularly challenging because it requires a higher energy emission compared to red or green. In certain embodiments of the present invention, blue emission is more easily achieved by transferring the electron directly into the triplet state. In this way, it is not necessary to provide the additional energy required for the electron to enter the emissive layer host LUMO. Because the electron need not enter the emissive layer host LUMO, a wider variety of host materials can be used to practice this embodiment of the present invention.

The present invention also provides an OLED having a series of such energy steps in a transport layer. In this embodiment, the present invention provides an organic light emitting device comprising: a) an anode; b) a cathode; c) an emissive layer disposed between the anode and the cathode, the emissive layer comprising i) a phosphorescent dopant having a phosphorescent dopant HOMO energy level, a phosphorescent dopant LUMO energy level, a triplet energy, and a singlet energy, and ii) an emissive layer host having an emissive layer host HOMO energy level and an emissive layer host LUMO energy level; and d) a transport layer disposed adjacent to the emissive layer, the transport layer comprising a plurality of materials, each material having a HOMO energy level and a LUMO energy level, wherein at least one energy level of each of the plurality of materials together form a series of energy steps leading to at least one energy level in the emissive layer, wherein each step in the series of energy steps is no more than about 0.2 eV. Preferably, the device also includes an energy separation that is about equal to the triplet energy, as described in detail above.

In one embodiment, the transport layer is a hole transport layer and the HOMO energy levels of the plurality of materials form a series of energy steps leading to the emissive layer host HOMO or the phosphorescent dopant HOMO, wherein each step in the series of energy steps is no more than about 0.2 eV.

In one embodiment, the transport layer is an electron transport layer and the LUMO energy levels of the plurality of materials form a series of energy steps leading to the emissive layer host LUMO or the phosphorescent dopant LUMO, wherein each step in the series of energy steps is no more than about 0.2 eV.

In one embodiment, the transport layer comprises a sublayer disposed adjacent to the emissive layer, wherein the sublayer comprises a transport layer host that is doped with a mixture of more than one material of the plurality of materials. See, e.g., FIGS. 7A and 8A. In one embodiment, the transport layer host is doped with a mixture of all of the materials, preferably in equal proportions. In one embodiment, the transport layer comprises a plurality of adjacent sublayers, each sublayer comprising a transport layer host doped with a single material of the plurality of materials. The transport layer host of each sublayer may be the same or different.

In one embodiment, the entire transport layer is doped with one or more materials of the plurality of materials. Alternatively, the transport layer may comprise a) an un-doped sublayer disposed adjacent to b) a doped sublayer comprising one or more materials of the plurality of materials, the doped sublayer disposed adjacent to c) the emissive layer.

In another embodiment, the transport layer comprises one or more neat layers. In a preferred embodiment, the transport layer comprises a plurality of neat layers, each neat layer comprising one material of the plurality of materials to form the series of energy steps. See, e.g., FIGS. 7B and 8B.

In yet another embodiment, the present invention provides methods of making the OLEDs of the present invention.

In one embodiment, the present invention provides a method comprising: a) depositing an anode over a substrate; b) depositing an emissive layer over the anode, wherein the emissive layer comprises i) a phosphorescent dopant having a phosphorescent dopant HOMO energy level, a phosphorescent dopant LUMO energy level, a triplet energy, and a singlet energy, and ii) an emissive layer host having an emissive layer host HOMO energy level and an emissive layer host LUMO energy level; c) depositing an electron transport layer over the emissive layer, wherein the electron transport layer comprises an electron transport material having an electron transport material LUMO energy level; and d) depositing a cathode over the electron transport layer, wherein the energy separation between i) the electron transport material LUMO or the emissive layer host LUMO, and ii) the phosphorescent dopant HOMO is at least about equal to the triplet energy of the phosphorescent dopant and at least about 0.2 eV less than the singlet energy of the phosphorescent dopant.

The electron transport layer can further comprise a plurality of materials, wherein the LUMO energy levels of the plurality of materials form a series of energy steps leading to the emissive layer host LUMO or the phosphorescent dopant LUMO, wherein each step in the series of energy steps is no more than about 0.2 eV.

In another embodiment, the present invention provides a method comprising: a) depositing an anode over a substrate; b) depositing a hole transport layer over the anode, wherein the hole transport layer comprises a hole transport material having a hole transport HOMO energy level, c) depositing an emissive layer over the hole transport layer, wherein the emissive layer comprises i) a phosphorescent dopant having a phosphorescent dopant HOMO energy level, a phosphorescent dopant LUMO energy level, a triplet energy, and a singlet energy, and ii) an emissive layer host having an emissive layer host HOMO energy level and an emissive layer host LUMO energy level; and d) depositing a cathode over the emissive layer, wherein the energy separation between i) the hole transport HOMO or the emissive layer host HOMO, and ii) the phosphorescent dopant LUMO is at least about equal to the triplet energy of the phosphorescent dopant and at least about 0.2 eV less than the singlet energy of the phosphorescent dopant.

The hole transport layer can further comprise a plurality of materials, wherein the HOMO energy levels of the plurality of materials form a series of energy steps leading to the emissive layer host HOMO or the phosphorescent dopant HOMO, wherein each step in the series of energy steps is no more than about 0.2 eV.

Figure 9:
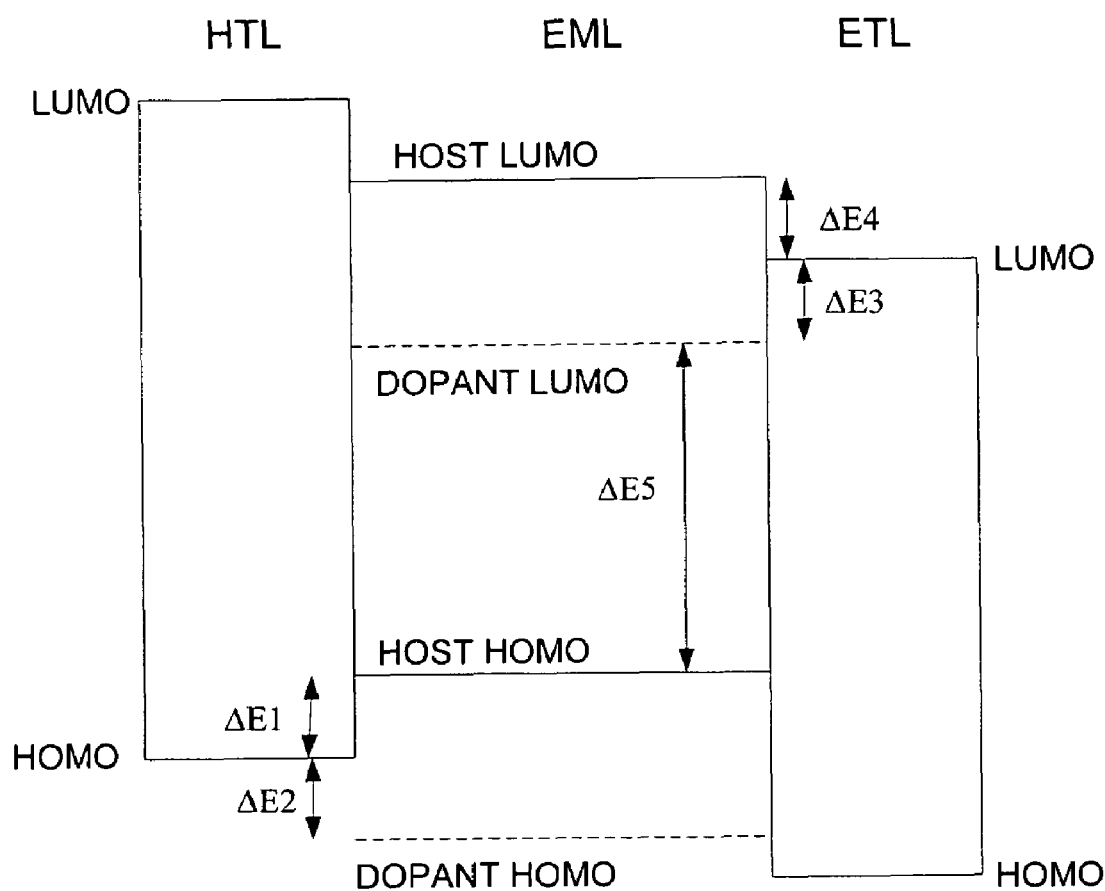
FIG. 9 shows an energy level diagram in which direct injection into a triplet state may occur without going through a singlet state, where an electron may be in a dopant LUMO prior to triplet formation.
Figure 10:
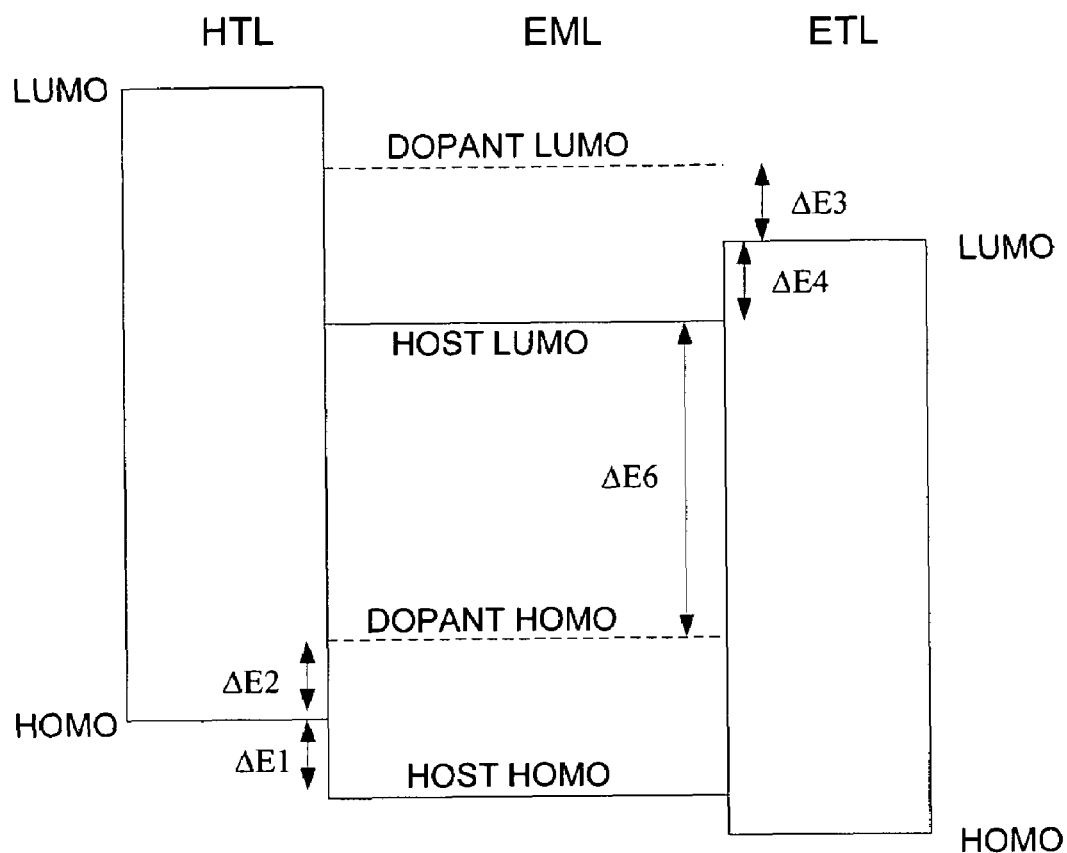
FIG. 10 shows an energy level diagram in which direct injection into a triplet state may occur without going through a singlet state, where a hole may be in a dopant HOMO prior to triplet formation.

FIGS. 9 and 10 show examples of energy level diagrams in which direct injection into a triplet excited state may occur without going through a singlet state. The relative energy levels of the various materials in the various layers are selected such that there is no energetically favorable way for a singlet excited state on the dopant to form.

FIG. 9 shows an energy level diagram in which direct injection into a triplet state may occur without going through a singlet state, where an electron may be in a dopant LUMO prior to triplet formation. If the dopant HOMO is lower than the HTL HOMO, and $\Delta E2$ is at least 0.2 eV, and the host HOMO is either higher than the HTL HOMO or not more than 0.1 eV less than the HTL HOMO, then it is believed that holes will be injected into the host HOMO and that it will be unlikely that holes will move to the dopant HOMO. In addition, if the host LUMO is higher than the ETL LUMO, and $\Delta E4$ is at least 0.2 eV, it is believed that it will be energetically unfavorable for electrons to move into the host LUMO and will instead become trapped on the dopant LUMO and/or be transported on the dopant LUMO. As a result, charge carriers in the ETL will be resident primarily in the LUMO of the dopant and the HOMO of the host. Finally, if $\Delta E5$, the difference between the host HOMO and the dopant LUMO, which in the configuration of FIG. 9 is also the energy separation between electrons and holes in the EML, is not more than 0.1 eV less than the triplet energy of the dopant, and $\Delta E5$ is at least 0.2 eV less than the singlet energy of the dopant, the energy difference between the electrons and holes in the emissive layer will be such that triplets on the dopant can form, but that it is energetically unfavorable for singlets on the dopant to form because the energy difference between electrons and holes is too much less than the energy needed to form a singlet. Note that these conditions will generally occur only if (but not necessarily if) the dopant HOMO and LUMO are not "nested" in the host HOMO and LUMO. In the example of FIG. 9, there is no nesting because the dopant HOMO is lower than the host HOMO.

FIG. 10 shows an energy level diagram in which direct injection into a triplet state may occur without going through a singlet state, where a hole may be in a dopant HOMO prior to triplet formation. If the host HOMO is lower than the HTL HOMO, and $\Delta E1$ is at least 0.2 eV, and the dopant HOMO is either higher than the HTL HOMO or not more than 0.1 eV less than the HTL HOMO, then it is believed that holes will be injected into the dopant HOMO and that it will be unlikely that holes will move to the host HOMO. In addition, if the dopant LUMO is higher than the ETL LUMO, and $\Delta E3$ is at least 0.2 eV, it is believed that it will be energetically unfavorable for electrons to move into the dopant LUMO and will instead become trapped on the host LUMO and/or be transported on the host LUMO. As a result, charge carriers in the ETL will be resident primarily in the LUMO of the host and the HOMO of the dopant. Finally, if $\Delta E6$, the difference between the host LUMO and the dopant HOMO, which in the configuration of FIG. 10 is also the energy separation between electrons and holes in the EML, is not more than 0.1 eV less than the triplet energy of the dopant, and $\Delta E6$ is at least 0.2 eV less than the singlet energy of the dopant, the energy difference between the electrons and holes in the emissive layer will be such that triplets on the dopant can form, but that it is energetically unfavorable for singlets on the dopant to form because the energy difference between electrons and holes is too much less than the energy needed to form a singlet. Note that these conditions will generally occur only if (but not necessarily if) the dopant HOMO and LUMO are not "nested" in the host HOMO and LUMO. In the example of FIG. 10, there is no nesting because the dopant LUMO is higher than the host LUMO.

More generally, to avoid configurations where singlets can form on the dopant, it is preferable to avoid configurations where charge carriers can be present on both the dopant HOMO and the dopant LUMO. This is because the singlet energy of the dopant is generally related to the difference between the HOMO and the LUMO of the dopant in such a way that singlets can form from an electron on the LUMO and a hole on the HOMO of the dopant. Nested energy level configurations, where the dopant HOMO and LUMO are nested within the host HOMO and LUMO, are undesirable because, in such a configuration, any electron-hole pair having an electron on the LUMO of either the host or the dopant, and a hole on the HOMO of either the host or the dopant, may have an energy level difference sufficient to form a singlet on the dopant.

FIGS. 9 and 10 illustrate the most preferred ways to achieve direct injection into the triplet excited state of the dopant without significant triplet formation, because triplet formation is possible throughout the EML. Other energy level configurations may be usable. For example, injection into the triplet excited state could occur from an electron on the LUMO of the ETL and a hole in the EML, either on the host or the dopant. Such a configuration may work to achieve triplet formation while avoiding the singlet excited state, but may be less preferred because such triplet formation would occur only at the EML/ETL interface. Similarly, injection into the triplet excited state could occur at the HTL/EML interface from a hole on the HOMO of the HTL and an electron on the LUMO of either the host or the dopant in the EML.

In the methods of the present invention, the plurality of materials can be co-deposited simultaneously, e.g., in a single doped layer. The materials can, but need not be deposited uniformly. In another embodiment, the materials are deposited sequentially in order of ascending energy levels. They materials may be deposited sequentially as a series of doped layers or as a series of neat layers.

It is understood that the various embodiments described herein are by way of example only, and are not intended to limit the scope of the invention. For example, many of the materials and structures described herein may be substituted with other materials and structures without deviating from the spirit of the invention. Also, features that are described in the context of one embodiment are not necessarily limited to that particular embodiment. The embodiments of the present invention may utilize any compatible feature described herein. It is understood that various theories as to why the invention works are not intended to be limiting. For example, theories relating to charge transfer are not intended to be limiting.

MATERIAL DEFINITIONS

As used herein, abbreviations refer to materials as follows:
CBP: 4,4'-N,N-dicarbazole-biphenyl
m-MTDATA 4,4',4"-tris(3-methylphenylphenlyamino)triphenylamine
$Alq_3$: 8-tris-hydroxyquinoline aluminum
Bphen: 4,7-diphenyl-1,10-phenanthroline
n-BPhen: n-doped BPhen (doped with lithium)
$F_4$-TCNQ: tetrafluoro-tetracyano-quinodimethane
p-MTDATA: p-doped m-MTDATA (doped with $F_4$-TCNQ)
$Ir(ppy)_3$: tris(2-phenylpyridine)-iridium
$Ir(ppz)_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: N,N'-diphenyl-N-N'-di(1-naphthyl)-benzidine
TPD: N,N'-diphenyl-N-N'-di(3-toly)-benzidine
BAlq: aluminum(III)bis(2-methyl-8-hydroxyquinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)

TCTA 4,4',4"-Tris(carbazol-9-yl)-triphenylamine

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device comprising:
   a) an anode;
   b) a cathode;
   c) an emissive layer disposed between the anode and the cathode, the emissive layer comprising
      i) a phosphorescent dopant having a phosphorescent dopant HOMO energy level, a phosphorescent dopant LUMO energy level, a triplet energy, and a singlet energy; and
      ii) an emissive layer host having an emissive layer host HOMO energy level and an emissive layer host LUMO energy level; and
   d) a transport layer disposed adjacent to the emissive layer, the transport layer comprising a first material having a first material HOMO energy level and a first material LUMO energy level, wherein electrons and holes introduced into the emissive layer have an energy difference less than the energy required to form a singlet on the dopant, such that the energy difference is sufficient for formation of triplets on the dopant and energetically unfavorable for formation of singlets on the dopant.

2. The device of claim 1, wherein the energy separation between the emissive layer host LUMO and the phosphorescent dopant HOMO is not more than 0.1 eV less than the triplet energy of the phosphorescent dopant.

3. The device of claim 1, wherein the energy separation between the emissive layer host HOMO and the phosphorescent dopant LUMO is not more than 0.1 eV less than the triplet energy of the phosphorescent dopant.

4. The device of claim 1, wherein the transport layer is an electron transport layer, and wherein the energy separation between the first material LUMO and the phosphorescent dopant HOMO is not more than 0.1 eV less than the triplet energy of the phosphorescent dopant.

5. The device of claim 1, wherein the transport layer is a hole transport layer, and wherein the energy separation between the first material HOMO and the phosphorescent dopant LUMO is not more than 0.1 eV less than the triplet energy of the phosphorescent dopant.

6. The device of claim 1, comprising two transport layers: an electron transport layer comprising an electron transport material, and a hole transport layer comprising a hole transport material, wherein the energy separation between the electron transport material LUMO and the hole transport material HOMO is not more than 0.1 eV less than the triplet energy of the phosphorescent dopant.

7. The device of claim 6, wherein the energy separation is at least 0.2 eV less than the singlet energy of the phosphorescent dopant.

8. The device of claim 1, wherein the phosphorescent dopant has a peak in the emission spectra that is less than 500 nm.

9. The organic light emitting device of claim 1, wherein the transport layer comprises a plurality of materials, each material having a HOMO energy level and a LUMO energy level, wherein at least one energy level of each of the plurality of materials together form a series of energy steps leading to at least one energy level in the emissive layer, wherein each step in the series of energy steps is no more than 0.2 eV.

10. An organic light emitting device, comprising:
   a) an anode;
   b) a cathode;
   c) an emissive layer disposed between the anode and the cathode, the emissive layer comprising
      i) a phosphorescent dopant having a phosphorescent dopant HOMO energy level, a phosphorescent dopant LUMO energy level, a triplet energy, and a singlet energy; and
      ii) an emissive layer host having an emissive layer host HOMO energy level and an emissive layer host LUMO energy level; and
   d) a transport layer disposed adjacent to the emissive layer, wherein the transport layer comprising comprises a plurality of materials, each material having a HOMO energy level and a LUMO energy level, wherein at least one energy level of each of the plurality of materials together form a series of energy steps leading to at least one energy level in the emissive layer, wherein each step in the series of energy steps is no more than 0.2 eV.

* * * * *